(12) United States Patent
Hopsecger et al.

(10) Patent No.: US 9,651,931 B2
(45) Date of Patent: May 16, 2017

(54) INDUSTRIAL CONTROL SYSTEM WITH INTEGRATED CIRCUIT ELEMENTS PARTITIONED FOR FUNCTIONAL SAFETY AND EMPLOYING WATCHDOG TIMING CIRCUITS

(71) Applicant: Rockwell Automation Technologies, Inc., Mayfield, OH (US)

(72) Inventors: Edward C. Hopsecger, Mentor, OH (US); Joseph G. Vazach, Mentor, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 300 days.

(21) Appl. No.: 14/644,515

(22) Filed: Mar. 11, 2015

(65) Prior Publication Data

US 2016/0266564 A1 Sep. 15, 2016

(51) Int. Cl.
| | |
|---|---|
| G05B 9/02 | (2006.01) |
| G05B 19/042 | (2006.01) |
| H03K 17/689 | (2006.01) |
| G06F 1/28 | (2006.01) |
| H03K 19/007 | (2006.01) |
| H04L 25/02 | (2006.01) |

(52) U.S. Cl.
CPC ........... G05B 19/0428 (2013.01); G06F 1/28 (2013.01); H03K 17/689 (2013.01); G05B 19/0425 (2013.01); G05B 2219/24003 (2013.01); G05B 2219/24015 (2013.01); G05B 2219/25158 (2013.01); G05B 2219/34466 (2013.01); H03K 19/0075 (2013.01); H04L 25/0266 (2013.01)

(58) Field of Classification Search
CPC ...... G05B 19/0428; G06F 1/28; H03K 17/689
USPC .......................................................... 700/79
See application file for complete search history.

(56) References Cited

U.S. PATENT DOCUMENTS 5,666,483 A * 9/1997 McClary ............... G06F 11/183
701/4
5,986,597 A * 11/1999 Stemporzewski, Jr. . B67D 7/32
137/400
7,319,406 B2 1/2008 Vazach et al.
(Continued)

FOREIGN PATENT DOCUMENTS

EP 2595018 A2 5/2013

OTHER PUBLICATIONS

EP Search Report for Application No. 16157340.7: Dated Jul. 29, 2016.

*Primary Examiner* — Vincent Tran
(74) *Attorney, Agent, or Firm* — Boyle Fredrickson, S.C.

(57) ABSTRACT

Safety and/or reliability may he improved in industrial control systems by optimally utilizing integrated circuit elements to reduce the amount of components required and to provide cross monitoring. In one aspect, circuitry that is part of an Integrated Circuit (IC) for controlling a first channel may also be used to monitor and provide safe operation for circuitry for controlling a second channel, and the circuitry for controlling the second channel may similarly be used to monitor and provide safe operation for the circuitry controlling the first channel. Circuitry may include a windowed watchdog circuit which may be used to monitor various events of the other circuitry, and safe operation may be provided by removing power from the other circuitry to provide a safe state.

20 Claims, 5 Drawing Sheets

(56) References Cited

U.S. PATENT DOCUMENTS

| | | | |
|---|---|---|---|
| 7,783,902 B2* | 8/2010 | Nakamura | G05B 19/058 |
| | | | 713/300 |
| 9,195,232 B1* | 11/2015 | Egnor | G05D 1/0055 |
| 2007/0294601 A1* | 12/2007 | Chitsaz | G06F 11/0757 |
| | | | 714/55 |
| 2013/0055052 A1 | 2/2013 | Kaeriyama | |
| 2014/0082434 A1* | 3/2014 | Knight | G05B 19/0428 |
| | | | 714/55 |
| 2015/0052407 A1* | 2/2015 | Fuchigami | G06F 11/0721 |
| | | | 714/55 |

* cited by examiner

FIG. 8

US 9,651,931 B2

INDUSTRIAL CONTROL SYSTEM WITH INTEGRATED CIRCUIT ELEMENTS PARTITIONED FOR FUNCTIONAL SAFETY AND EMPLOYING WATCHDOG TIMING CIRCUITS

BACKGROUND OF THE INVENTION

The subject matter disclosed herein relates generally to industrial controllers, and more specifically, to industrial controllers using integrated circuit elements with watchdog timing circuits.

Industrial controllers are specialized computer systems used for the control of industrial processes or machinery, for example, in a factory environment. Generally, an industrial controller executes a stored control program that reads inputs from a variety of sensors associated with the controlled process and machine and, sensing the conditions of the process or machine and based on those inputs and a stored control program, calculates a set of outputs used to control actuators controlling the process or machine.

Industrial controllers differ from conventional computers in a number of ways. Physically, they are constructed to be substantially more robust against shock and damage and to better resist external contaminants and extreme environmental conditions than conventional computers. The processors and operating systems are optimized for real-time control and are programmed with languages designed to permit rapid development of control programs tailored to a constantly varying set of machine control or process control applications.

Generally, the controllers have a highly modular architecture, for example, that allows different numbers and types of input and output modules to be used to connect the controller to the process or machinery to be controlled. This modularity is facilitated through the use of special "control networks" suitable for highly reliable and available real-time communication. Such control networks (for example, ControlNet or EtherNet/IP) differ from standard communication networks (such as Ethernet) by guaranteeing maximum communication delays by pre-scheduling the communication capacity of the network, and/or providing redundant communication capabilities for high-availability.

As industrial controllers are typically used to control industrial processes and machinery, industrial controllers typically require greater safety and reliability than conventional computers. For example, unlike conventional computers, a failure for an industrial controller in a manufacturing environment could potentially result in costly manufacturing downtime, injury, and the like. Moreover, increasing complexity of industrial control systems typically results in increasing numbers of parts with each susceptible to some amount of failure. Consequently, it is desirable to provide an efficient and cost effective way to increase the safety and/or reliability of industrial controllers and industrial control systems.

SUMMARY OF THE INVENTION

The inventors have recognized that safety and/or reliability may be improved in industrial control systems by optimally utilizing integrated circuit elements to reduce the amount of components required and to provide cross monitoring. In one aspect, circuitry that is part of an Integrated Circuit (IC) for controlling a first channel may also be used to monitor and provide safe operation for circuitry for controlling a second channel, and the circuitry for controlling the second channel may similarly be used to monitor and provide safe operation for the circuitry controlling the first channel. Circuitry may include a windowed watchdog circuit which may be used to monitor various events of the other circuitry, and safe operation may be provided by removing power from the other circuitry to provide a safe state.

Accordingly, functional safety control circuitry may be integrated within a mixed signal IC such as an Application Specific Integrated Circuit (ASIC), while leaving un-integrated those components which may be part of a high current path, or which may have thermal dissipation characteristics that are not appropriate for integration.

Through integration, reduced Printed Circuit Board (PCB) area may be required to implement functional safety. As a result, a reduced total number of failures in time may be attained.

A corresponding IC implementation may reduce product costs by decreasing total part costs, placement costs, and manufacturing costs. Moreover, the chance for a manufacturing error may be decreased, and the reduced parts may provide a reduced total failure in time summation.

A "windowed" watchdog timing circuit may be provided to improve functional safety. A kick period, which may be adjustable, may nominally be provided, such as on the order of 4 ms. Tight control may be provided for a timeout period, such as $2\ ms \leq Timeout \leq 6\ ms$. A timeout may cause the output of the watchdog timing circuit to latch to a "disable" state. However, subsequently, multiple successive good kicks may operably re-enable the output. Operational voltage may be designed to handle external fault cases, and internal over-voltage or under-voltage detection may be provide to ensure that other components are operating within specification.

Accordingly, an input to the watchdog circuit that pulses either too slowly or too fast may cause a timeout condition which may result in a hard disable of downstream circuitry, such as removing power for driving electrical signals. Multiple successive (in specification) events may cause the watchdog circuit to return to an enable state, which may thereby restore power and/or allow a state change diagnostic to be executed.

Specifically, in one aspect, the present invention provides an industrial control system including first and second integrated circuit elements providing first and second field signals, respectively, and first and second activity signals, respectively. The first and second integrated circuit elements may each include a watchdog timing circuit. First and second power shut-off components may be configured to selectively switch between 1) providing power for the first and second field signals, respectively, and 2) removing power from the first and second field signals, respectively. The watchdog timing circuit of the first integrated circuit element may receive the second activity signal from the second integrated circuit element, and the watchdog timing circuit of the second integrated circuit element may receive the first activity signal from the first integrated circuit element. The watchdog timing circuit of the first integrated circuit element may be configured to trigger the second power shutoff component to selectively switch, and the watchdog timing circuit of the second integrated circuit element may be configured to trigger the first power shut-off component to selectively switch.

In addition, the watchdog timing circuits may each be configured to trigger the respective power shut-off component to selectively switch to removing power upon detecting an edge of the received activity signal within a first predetermined amount of time. Also, the watchdog timing circuits may each be configured to trigger the respective power shut-off component to selectively switch to removing power upon failing to detect an edge of the received activity signal within a second predetermined amount of time. Also, the watchdog timing circuits may each be configured to trigger the respective power shut-off component to selectively switch to providing power upon detecting at least three edges of the received activity signal in which each edge is detected after a first predetermined, amount of time and before a second predetermined amount of time.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION OF THE PREFERRED EMBODIMENT

Figure 1:
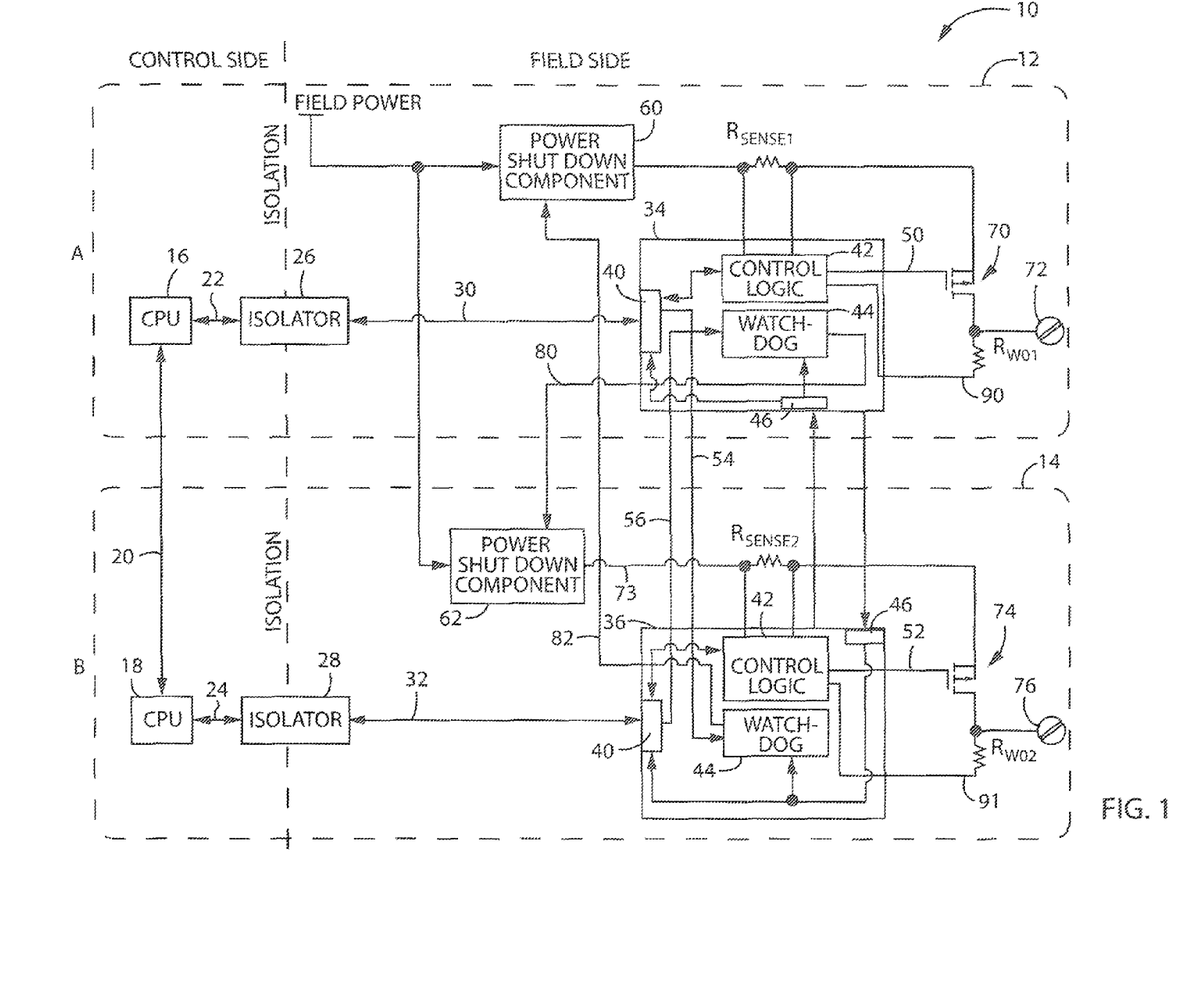
FIG. 1 is a simplified diagram of an industrial control system including integrated circuit elements each including a watchdog timing circuit provided in accordance with an embodiment of the invention.

Referring now to FIG. 1, a simplified diagram of an exemplar industrial control system 10 is provided in accordance with an embodiment of the invention. The industrial control system 10 may include a plurality of channels, such as a system implementing an 8-channel configuration, with each channel including both an even side 12 (which may be referred to by way of example as an "A" side) and an odd side 14 (which may be referred to by way of example as a "B" side). The A side and B side of each channel may provide redundancy with respect to one another for a particular channel, such as providing identical redundancy or true and complement pair redundancy, to provide increased fault tolerance and reliability.

In one aspect, the A sides of each of the channels may be controlled by a single processing element, such as a first processor 16, while the B sides of each of the channels may be controlled by a separate processing element, such as a second processor 18. The first and second processors 16 and 18 may be on a "control" side of the industrial control system 10. The first and second processors 16 and 18 may each process data in a redundant manner by each executing a stored program for providing industrial control over an industrial process or machine (not shown). The first and second processors 16 and 18 may be in synchronous communication and may include a communications link 20 extending between the first and second processors 16 and 18. The first and second processors 16 and 18 may communicate first and second I/O control side signals 22 and 24, respectively, for controlling the industrial process or machinery. The first and second I/O control side signals 22 and 24 may be used, for example, to receive inputs from sensors and provide outputs to actuators for the industrial process or machine. The first and second I/O control side signals 22 and 24 may be provided in parallel or may be serialized, including as described in U.S. Pat. No. 7,319,406, titled "System and method of channel serialization in a safety I/O product," the contents of which incorporated herein by reference in its entirety.

The first and second I/O control side signals 22 and 24 may be in communication with first and second isolators 26 and 28, respectively. Accordingly, the first and second isolators 26 and 28 serve to electrically isolate the control side, including the first and second processors 16 and 18, from hardware more directly in communication the industrial process or machine on a "field" side. This provides increased safety and reliability by electrically separating lower power electronics/processes (on the control side) from higher power electronics/processes (on the field side). The first and second isolators 26 and 28 may be, for example, optical couplers, magnetic couplers, fiber optic elements, or the like, to isolate the field side from the control side. Accordingly, the first and second I/O control side signals 22 and 24 may communicate with the first and second isolators 26 and 28, respectively, with corresponding first and second I/O isolated signals 30 and 32, respectively, produced.

Figure 2:
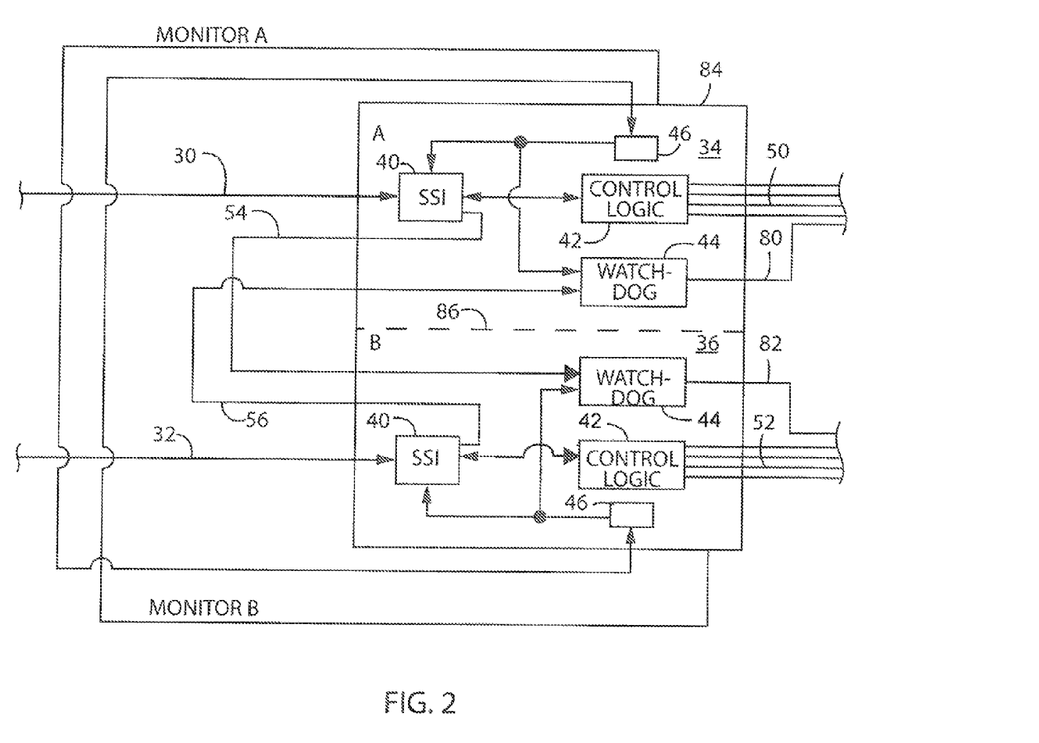
FIG. 2 is a simplified diagram of the industrial control system of FIG. 1 in which the integrated circuit elements are part of a single Integrated Circuit.
Figure 3:
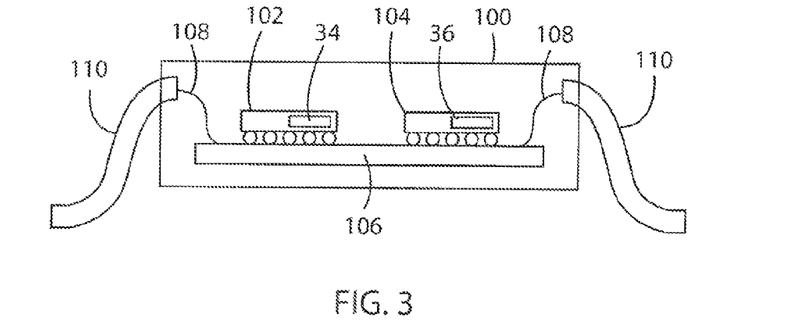
FIG. 3 is a cross section of a package in which the integrated circuit elements are provided as separate Integrated Circuits contained in a single package.
Figure 4:
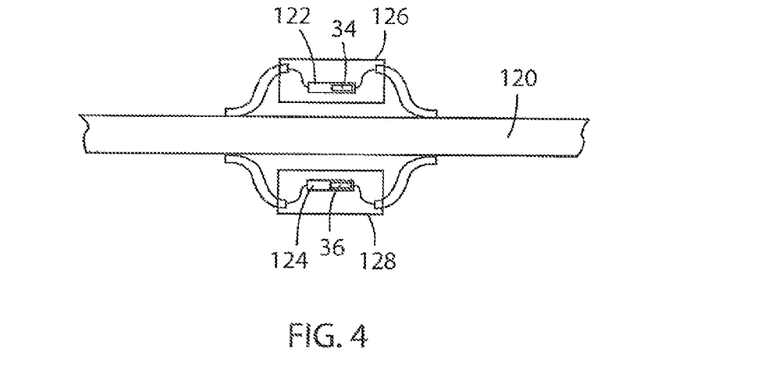
FIG. 4 is a cross section of integrated circuit elements provided as separate Integrated Circuits contained in separate packages mounted on opposite sides of a system board.

In turn, the first and second I/O isolated signals 30 and 32 on the field side may be in communication with first and second integrated circuit elements 34 and 36, respectively. The first and second integrated circuit elements 34 and 36 may be separate Integrated Circuits or merely separate parts of a single Integrated Circuit. If configured as a single Integrated Circuit, the first and second integrated circuit elements 34 and 36 are preferably electrically isolated from one another on a single die as shown in FIG. 2. If configured as separate Integrated Circuits, the first and second integrated circuit elements 34 and 36 may be separate dies contained in a single package, as shown in FIG. 3, or may be separate dies in separate packages, as shown in FIG. 4. If separate dies in separate packages, the first and second integrated circuit elements 34 and 36 may be mounted, for example, on the same side of a single Printed Circuit Board (PCB)/system board, or preferably, on opposite sides of a system board. The first and second integrated circuit elements 34 and 36 may accommodate high voltages, such as >60V, including for field side signaling. In a preferred embodiment, the first and second integrated circuit elements 34 and 36 may be implemented on a single or separate mixed signal Application Specific Integrated Circuits (ASIC's) having both analog and digital circuits.

The first and second integrated circuit elements 34 and 36 may include approximately identical structure, including a Safety Serial Interfaces 40, a Control Logic block 42, a watchdog timing circuit 44, and a health monitor 46. The Safety Serial interface 40 may communicate the first and second I/O isolated signals, such as the first and second I/O isolated signals 30 and 32, and in turn communicate corresponding I/O communication with the Control Logic block 42. In turn, the Control Logic block 42 may communicate I/O field signals, such as the first and second I/O field signals 50 and 52 provided by the first and second integrated circuit elements 34 and 36, respectively.

The Safety Serial Interface 40 may also provide an activity signal, such as the first and second activity signals 54 and 56 provided by the first and second integrated circuit elements 34 and 36, respectively. In one aspect, the activity signal may be a heartbeat bit communicated with the first and second I/O control side signals 22 and 24 and, in turn, the first and second I/O isolated signals 30 and 32. To provide cross checking, the watchdog timing circuit 44 of the first integrated circuit element 34 receives the second activity signal 56 from the second integrated circuit element 36, such as from the Safety Serial Interface 40 of the second integrated circuit element 36. Similarly, the watchdog timing circuit 44 of the second integrated circuit element 36 receives the first activity signal 54 from the first integrated circuit element 34, such as from the Safety Serial Interface 40 of the first integrated circuit element 34.

The health monitor 46 may provide certain health monitoring and reporting from one integrated circuit element to another. For example, the health monitor 46 of the first integrated circuit element 34 may be configured to detect over-voltage and/or under-voltage conditions for certain signals, such as from the second I/O isolated signal 32, the second I/O field signals 52 or 91, and/or I/O internal voltage regulators (not shown) of the second integrated circuit element 36, and may accordingly report the status to the first integrated circuit element 34, such as to the Safety Serial interface 40 and/or the watchdog timing circuit 44 of the first integrated circuit element 34. Similarly, the health monitor 46 of the second integrated circuit element 36 may be configured to detect over-voltage and/or under-voltage for certain signals, such as from the first I/O isolated signal 30, the first I/O field signals 50 or 90, and/or I/O internal voltage regulators (not shown) of the first integrated circuit element 34, and may accordingly report the status to second integrated circuit element 36, such as to the Safety Serial Interface 40 and/or the watchdog timing circuit 44 of the second integrated circuit element 36.

In the industrial control system 10, first and second power shut-off components 60 and 62 are provided. The first and second power shut-off components 60 and 62, which may include high power transistors, relays, or otherwise, may be configured to selectively switch between 1) providing power in the field side, and 2) removing power from the field side. The first power shut-off component 60 may be coupled with the first integrated circuit element 34 to provide power for the first I/O field signal 50 or remove power from the first I/O field signal 50. For example, the first power shut-off component 60 may selectively switch to conduct A side field power 68 to a first MOSFET 70, controlled by the first integrated circuit element 34, used for communicating the first I/O field signal 50 with a first screw terminal 72. However, in an event necessary to provide a safe condition, the first power shut-off component 60 may selectively switch to stop conducting A side field power 68 to the first. MOSFET 70, thereby removing power from the first I/O field signal 50. The first integrated circuit element 34 may continuously monitor a state of the A side field power 68 via connections across a low value resistor "$R_{SENSE1}$".

Similarly, the second power shut-off component 62 may be coupled with the second integrated circuit element 36 to provide power for the second I/O field signals 52 or remove power from the second. I/O field signals 52. For example, the second power shut-off component 62 may selectively switch to conduct B side field power 73 to a second MOSFET 74, controlled by the second integrated circuit element 36, used for communicating the second I/O field signal 52 with a second screw terminal 76. However, in an event necessary to provide a safe condition, the second power shut-off component 62 may selectively switch to stop conducting the B side field power 73 to the second MOSFET 74, thereby removing power from the second I/O field signal 52. The second integrated circuit element 36 may continuously monitor a state of the B side field power 73 via connections across a low value resistor "$R_{SENSE2}$".

In providing cross checking, the watchdog timing circuit 44 of the first integrated circuit element 34 is configured to cause, via a first watchdog output 80, the second power shut-off component 62 to selectively switch. Similarly, the watchdog timing circuit 44 of the second integrated circuit element 36 is configured to cause, via a second watchdog output 82, the first power shut-off component 60 to selectively switch.

Referring now to FIG. 2, a simplified diagram of the industrial control system 10 is provided in which the first and second integrated circuit elements 34 and 36 are part of a single Integrated Circuit 84. The single Integrated Circuit 84 may preferably be a mixed signal ASIC in which the first and second integrated circuit elements 34 and 36 are electrically isolated from one another. As used herein, electrical isolation means separation such that no electrical signals from one area electrically connect to electrical signals of another area. Preferably, power and ground planes of the single Integrated Circuit 84 may be separated as well for even greater reliability, though not required.

A boundary 86 exemplifies a demarcation line on the Integrated Circuit 84 in which the first integrated circuit element 34 is electrically isolated, and in effect partitioned, from the second integrated circuit element 36 on the single Integrated Circuit 84. Connections between the first and second integrated circuit elements 34 and 36, such as for the first and second activity signals 54 and 56 and/or the monitoring signals, may be provided external to Integrated Circuit 84, such as by way of copper traces on an FR4 or other type of PCB which may be within the integrated circuit package or which may be on the system board.

Referring now to FIG. 3, a cross section of a single package 100 is provided in accordance with an embodiment of the invention. In this aspect, the first and second integrated circuit elements 34 and 36 are provided as separate first and second Integrated Circuits 102 and 104 contained in the package 100. The first and second Integrated Circuits 102 and 104 may be mounted, for example, as ball-grid array chips on a PCB 106 contained in the package 100. Connections between the first and second Integrated Circuits 102 and 104, such as for the first and second activity signals 54 and 56 and/or the monitoring signals, may be made via copper traces on the PCB 106. Other connections to or from the first and second Integrated Circuits 102 and 104, such as for the first and second I/O isolation signals 30 and 32, the first and second I/O field signals 50 and 52, first and second watchdog outputs 80 and 82, and the like, may be made via copper traces on the PCB 106 connecting to wire bonds 108 which, in turn, connect to pins 110. Of course other packaging types may be used within the scope of the invention.

Referring now to FIG. 4, a cross section of a system board 120 is provided in accordance with an embodiment of the invention. In this aspect, the first and second integrated circuit elements 34 and 36 are provided as separate first and second Integrated Circuits 122 and 124, respectively. The separate first and second integrated Circuits 122 and 124 are contained in separate first and second packages 126 and 128, respectively, mounted on opposite sides of the system board 120.

Figure 5:
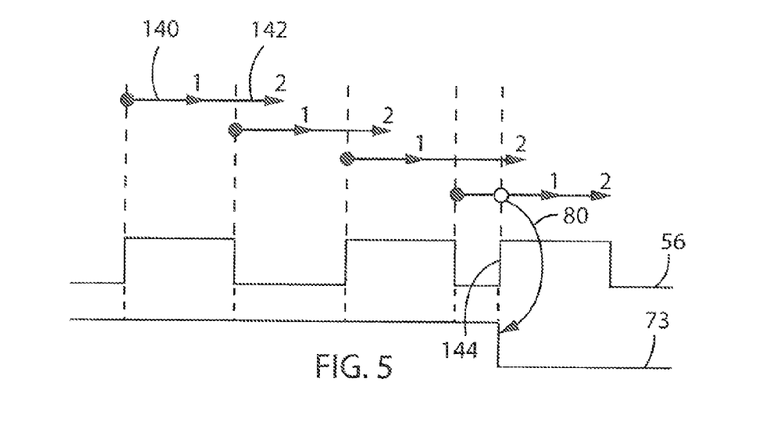
FIG. 5 is a timing diagram illustrating the watchdog timing circuit of FIGS. 1-4 removing power upon detecting an edge of the received activity signal within a first predetermined amount of time.
Figure 6:
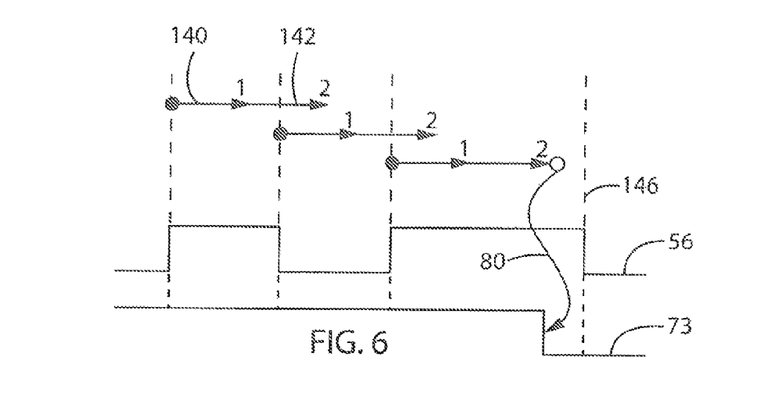
FIG. 6 is a timing diagram illustrating the watchdog timing circuit of FIGS. 1-4 removing power upon failing to detect an edge of the received activity signal within a second predetermined amount of time.

Referring now to FIGS. 5 and 6, timing diagrams illustrating operation of the watchdog timing circuit 44 of FIGS. 1-4 are provided. For simplicity, operation of the watchdog timing circuit 44 of the first integrated circuit element 34 (with related signals) is illustrated, though operation of the watchdog timing circuit 44 of the second integrated circuit element 36 may be substantially identical.

From each rising or falling edge of the received activity signal (such as the second activity signal 56), the watchdog timing circuit 44 may initiate timers to track a first predetermined amount of time 140 (also illustrated as "1") and a second predetermined amount of time 142 (also illustrated as "2"). The first predetermined amount of time may be, for example, >2 ms, and the second predetermined amount of time may be, for example, <6 ms. An edge of the received activity signal occurring within the first predetermined amount of time 140 may be considered to occur too fast, thereby causing an output signal to remove power. Also, an edge of the received activity signal not occurring within the second predetermined amount of time 142 may be considered to occur too slow, thereby causing an output signal to remove power. In other words, the watchdog timing circuit 44 continuously tracks a window from each edge of the activity signal in which a following edge of the activity signal is expected to occur in order to continue to conduct power.

As illustrated in FIG. 5, an early arriving edge 144 of the second activity signal 56, which occurs within the first predetermined amount of time 140, may cause the watchdog timing circuit 44 of the first integrated circuit element 34 to alert via the first watchdog output 80. In this instance, the watchdog timing circuit 44 alerts at the early arriving edge 144. Consequently, as a result of the first watchdog output 80, the second power shut-off component 62 may selectively switch to remove the B side field power 73 to return to a safe condition, Similarly, as illustrated in FIG. 6, a late arriving edge 146 of the second activity signal 56, which fails to occur within the second predetermined amount of time 142, may cause the watchdog timing circuit 44 of the first integrated circuit element 34 to alert via the first watchdog output 80. In this instance, the watchdog timing circuit 44 alerts at the expiration of the second predetermined amount of time 142. Consequently, as a result of the first watchdog output 80, the second power shut-off component 62 may selectively switch to remove the B side field power 73 to return to a safe condition. Accordingly, the watchdog timing circuit 44 provides "windowed" watchdog timing in which an output signal may result from receiving a signal either too fast or too slow. The windowed watchdog may provide tight control, for example, such as 2 ms<Timeout> 6 ms.

Figure 7:
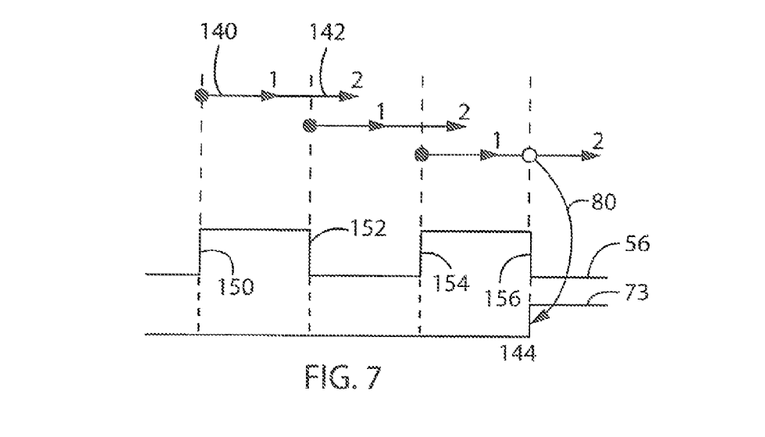
FIG. 7 is a timing diagram illustrating the watchdog timing circuit of FIGS. 1-4 providing power upon detecting at least three edges of the received activity signal in which each edge is detected after a first predetermined amount of time and before a second predetermined amount of time.

Referring now to FIG. 7, a timing diagram illustrating further operation of the watchdog timing circuit 44 of FIGS. 1-4 are provided. Again, for simplicity, operation of the watchdog timing circuit 44 of the first integrated circuit element 34 (with related signals) is illustrated, though operation of the watchdog timing circuit 44 of the second integrated circuit element 36 may be substantially identical, With field power removed, it may be possible for the watchdog timing circuit 44 to detect the return of a safe operating condition, via the received activity signal, and again provide field power. With field power removed, from each consecutive rising and falling edge of the received activity signal (such as the second activity signal 56), the watchdog timing circuit 44 may initiate timers to track the first predetermined amount of time 140 and the second predetermined amount of time 142 with respect to a following edge. After at least three consecutive edges of the received activity signal each occurring after the first predetermined amount of time and before the second predetermined amount of time, field power may be restored without user intervention.

For example, with the B side field power 73 removed, the watchdog timing circuit 44 of the first integrated circuit element 34 may initiate timers with respect to a first edge 150 of the second activity signal 56. From the first edge 150, the watchdog timing circuit 44 may detect a second edge 152 of the second activity signal 56 to occur after the first predetermined amount of time and before the second predetermined amount of time. Then, from the second edge 152, the watchdog timing circuit 44 may detect a third edge 154 of the second activity signal 56 to occur after the first predetermined amount of time and before the second predetermined amount of time. Then, from the third edge 154, the watchdog timing circuit 44 may detect a fourth edge 156 of the second activity signal 56 to occur after the first predetermined amount of time and before the second predetermined amount of time. The fourth edge 156 causes the watchdog timing circuit 44 of the first integrated circuit element 34 to alert, via the first watchdog output 80, the power shut-off component 62 to selectively switch to providing field power. As a result, by allowing three consecutive good timing pulses which meet a required specification to allow power to be restored, a diagnostic can be performed, such as for determining the reason for the initial power loss.

In alternative aspects, the watchdog timing circuit 44 may examine for varying patterns or sequences of the activity signal before determining a safe condition to be present in which field power may be returned. Such aspects are deemed within the scope of the invention.

Figure 8:
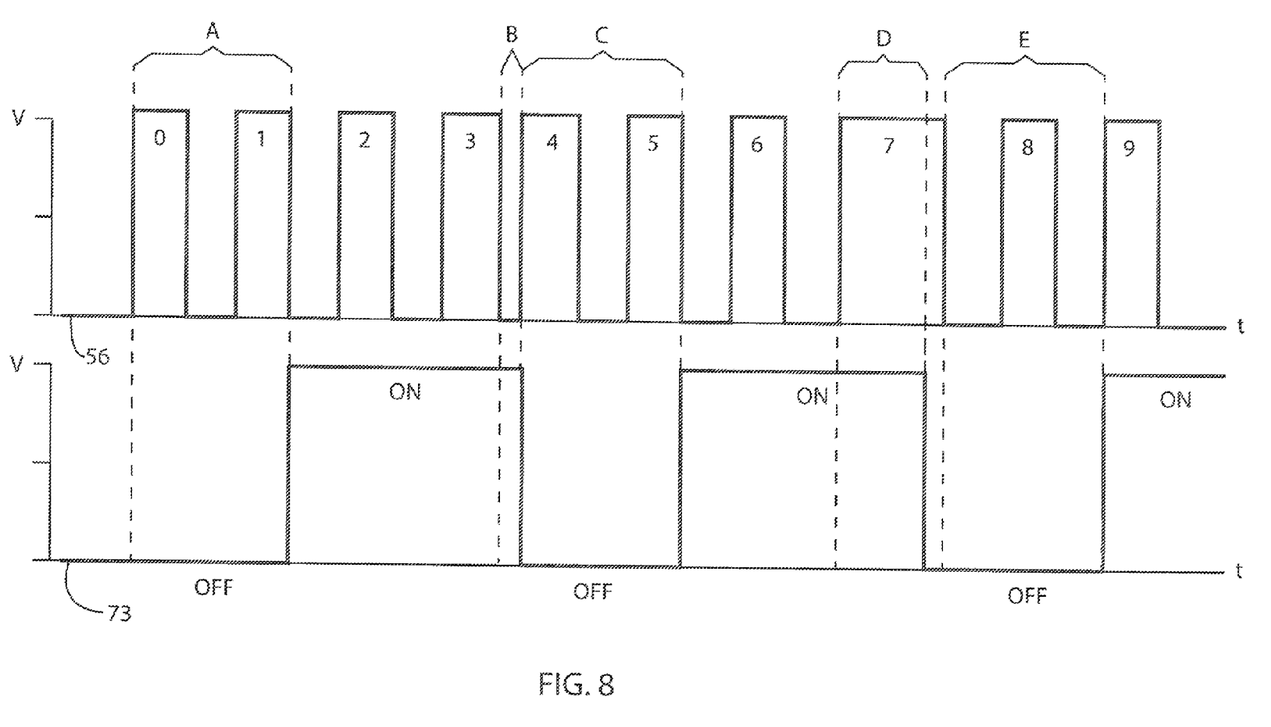
FIG. 8 is a timing diagram illustrating the watchdog timing circuit of FIGS. 1-4 providing power and removing power under various conditions.

Referring now to FIG. 8, a timing diagram illustrating operation of the watchdog timing circuit 44 of FIGS. 1-4 under various conditions is provided. Again, for simplicity, operation of the watchdog timing circuit 44 of the first integrated circuit element 34 (with related signals) is illustrated, though operation of the watchdog timing circuit 44 of the second integrated circuit element 36 may be substantially identical.

In a time period "A," the B side field power 73 may be removed to provide a safe condition. However, in the time period "A," the watchdog timing circuit 44 may detect three consecutive edges of the second activity signal 56 (for example, the falling edge of pulse "0," the rising edge of pulse "1", and the falling edge of pulse "1"), each occurring after a first predetermined amount of time and before a second predetermined amount of time with respect to a preceding edge. As a result, the watchdog timing circuit 44 may cause the power shut-off component 62 to restore the B side field power 73 without user intervention. In other words, multiple successive "in spec" signals cause the output to go to its enable state, which may thereby allow a "state change" diagnostic to be executed.

Subsequently, in a time period "B," the watchdog timing circuit 44 may detect a rising edge of pulse "4" to occur within the first predetermined amount of time. In other words, the watchdog timing circuit 44 may detect the rising edge of pulse "4" to occur too fast. As a result, the watchdog timing circuit 44 may cause the power shut-off component 62 to remove the B side field power 73.

Next, in a time period "C," the watchdog timing circuit 44 may again detect three consecutive edges of the second activity signal 56 (for example, the falling edge of pulse "4," the rising edge of pulse "5," and the falling edge of pulse "5"), each occurring after a first predetermined amount of time and before a second predetermined amount of time with respect to a preceding edge. As a result, the watchdog timing circuit 44 may cause the power shut-off component 62 to restore the B side field power 73 without user intervention.

Subsequently, in a time period "D," the watchdog timing circuit 44 may fail to detect an edge of the second activity signal 56 to occur within the second predetermined amount of time. In other words, the falling edge of pulse "7" occurs too slowly. As a result, the watchdog timing circuit 44 may cause the power shut-off component 62 to remove the B side field power 73.

Finally, in a time period "E," the watchdog timing circuit 44 may again detect three consecutive edges of the second activity signal 56 (for example, the rising edge of pulse "8," the falling edge of pulse "8," and the rising edge of pulse "9"), each occurring after a first predetermined amount of time and before a second predetermined amount of time with respect to a preceding edge. As a result, the watchdog timing circuit 44 may cause the power shut-off component 62 to restore the B side field power 73 without user intervention.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom" and "side" describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

References to "a microprocessor" and "a processor" or "the microprocessor" and "the processor," can be understood to include one or more microprocessors that can communicate in a stand-alone and/or a distributed environment(s), and can thus be configured to communicate via wired or wireless communications with other processors, where such one or more processor can be configured to operate on one or more processor-controlled devices that can be similar or different devices. Furthermore, references to memory, unless otherwise specified, can include one or more processor-readable and accessible memory elements and/or components that can be internal to the processor-controlled device, external to the processor-controlled device, and can be accessed via a wired or wireless network.

It is specifically intended that the present invention not be limited to the embodiments and illustrations contained herein and the claims should be understood to include modified forms of those embodiments including portions of the embodiments and combinations of elements of different embodiments as come within the scope of the following claims. All of the publications described herein, including patents and non-patent publications, arc hereby incorporated herein by reference in their entireties.

What is claimed is:

1. An industrial control system comprising:
    first and second integrated circuit elements communicating first and second field signals, respectively, and first and second activity signals, respectively, the first and second integrated circuit elements each including a watchdog timing circuit; and
    first and second power shut-off components configured to selectively switch between 1) providing power for the first and second field signals, respectively, and 2) removing power from the first and second field signals, respectively,
    wherein the watchdog timing circuit of the first integrated circuit element receives the second activity signal from the second integrated circuit element, and the watchdog timing circuit of the second integrated circuit element receives the first activity signal from the first integrated, circuit element, and
    wherein the watchdog timing circuit of the first integrated, circuit element is configured to cause the second power shut-off component to selectively switch, and the watchdog timing circuit of the second integrated circuit element is configured to cause the first power shut-off component to selectively switch.

2. The industrial control system of claim 1, wherein the watchdog timing circuits are each configured to cause the respective power shut-off component to selectively switch to removing power upon detecting an edge of the received activity signal within a first predetermined amount of time.

3. The industrial control system of claim 1, wherein the watchdog timing circuits are each configured to cause the respective power shut-off component to selectively switch to removing power upon failing to detect an edge of the received activity signal within a second predetermined amount of time.

4. The industrial control system of claim 1, wherein the watchdog timing circuits are each configured to cause the respective power shut-off component to selectively switch to providing power upon detecting at least three edges of the received activity signal, wherein each edge is detected after a first predetermined amount of time and before a second predetermined amount of time.

5. The industrial control system of claim 1, wherein the first and second integrated circuit elements are separate Integrated Circuits.

6. The industrial control system of claim 5, wherein the separate Integrated Circuits are contained in a single package.

7. The industrial control system of claim 5, wherein the separate Integrated Circuits are contained in separate packages mounted on opposite sides of a system board.

8. The industrial control system of claim 1, wherein the first and second integrated circuit elements are part of a single Integrated Circuit.

9. The industrial control system of claim 8, wherein the first and second integrated circuit elements are electrically isolated from one another on the single Integrated Circuit.

10. The industrial control system of claim 8, wherein the single Integrated Circuit is a mixed signal Application Specific Integrated Circuit (ASIC) having both analog and digital circuits.

11. The industrial control system of claim 1, further comprising first and second screw terminals for communicating the first and second field signals, respectively'.

12. An industrial control system comprising:
first and second integrated circuit elements communicating first and second field signals, respectively, and first and second activity signals, respectively, the first and second integrated circuit elements each including a watchdog tuning circuit; and
first and second power shut-off components configured to selectively switch between 1) providing power for the first and second field signals, respectively, and 2) removing power from the first and second field signals, respectively,
wherein the watchdog timing circuit of the first integrated circuit element receives the second activity signal from the second integrated circuit element, and the watchdog timing circuit of the second integrated circuit element receives the first activity signal from the first integrated circuit element,
wherein the watchdog timing circuit of the first integrated circuit element is configured to cause the second power shut-off component to selectively switch, and the watchdog timing circuit of the second integrated circuit element is configured to cause the first power shut-off component to selectively switch,
wherein the watchdog timing circuits are each configured to cause the respective power shut-off component to selectively switch to removing power upon detecting an edge of the received activity signal within a first predetermined amount of time, and wherein the watchdog timing circuits are each configured to cause the respective power shut-off component to selectively switch to removing power upon failing to detect an edge of the received activity signal within a second predetermined amount of time.

13. The industrial control system of claim 12, wherein the watchdog timing circuits are each configured to cause the respective power shut-off component to selectively switch to providing power upon detecting at least three edges of the received activity signal, wherein each edge is detected after a first predetermined amount of time and before a second predetermined amount of time.

14. The industrial control system of claim 12, wherein the first and second integrated circuit elements are part of a mixed signal Application Specific Integrated Circuit (ASIC) having both analog and digital circuits, and the first and second integrated circuit elements are electrically isolated from one another on the ASIC.

15. The industrial control system of claim 12, wherein the first and second integrated circuit elements are separate Integrated Circuits, and the separate Integrated Circuits are mounted on opposite sides of a system board.

16. An industrial control system comprising:
first and second processors;
first and second isolators in communication with the first and second processors, the first and second isolators providing electrical isolation for the first and second processors;
first and second integrated circuit elements in communication with the first and second isolators, the first and second integrated circuit elements providing first and second field signals, respectively, and first and second activity signals, respectively, the first and second integrated circuit elements each including a watchdog timing circuit;
first and second screw terminals in communication with the first and second field signals, respectively, and
first and second power shut-off components configured to selectively switch between 1) providing power for the first and second field signals, respectively, and 2) removing power from the first and second field signals, respectively,
wherein the watchdog timing circuit of the first integrated circuit element receives the second activity signal from the second integrated circuit element, and the watchdog timing circuit of the second integrated circuit element receives the first activity signal from the first integrated circuit element, and
wherein the watchdog timing circuit of the first integrated circuit element is configured to cause the second power shut-off component to selectively switch, and the watchdog timing circuit of the second integrated circuit element is configured to cause the first power shut-off component to selectively switch.

17. The industrial control system of claim 16, wherein the watchdog timing circuits are each configured to cause the respective power shut-off component to selectively switch to removing power upon detecting an edge of the received activity signal within a first predetermined amount of time.

18. The industrial control system of claim 16, wherein the watchdog timing circuits are each configured to cause the respective power shut-off component to selectively switch to removing power upon failing to detect an edge of the received activity signal within a second predetermined amount of time.

19. The industrial control system of claim 16, wherein the watchdog timing circuits are each configured to cause the respective power shut-off component to selectively switch to providing power upon detecting at least three edges of the received activity signal, wherein each edge is detected after a first predetermined amount of time and before a second predetermined amount of time.

20. The industrial control system of claim 16, wherein the first and second integrated circuit elements are part of a mixed signal Application Specific integrated Circuit (ARC) having both analog and digital circuits, and the first and second integrated circuit elements are electrically isolated from one another on the ASIC.

\* \* \* \* \*

UNITED STATES PATENT AND TRADEMARK OFFICE
CERTIFICATE OF CORRECTION

PATENT NO. : 9,651,931 B2  
APPLICATION NO. : 14/644515  
DATED : May 16, 2017  
INVENTOR(S) : Hopsecger et al.

Page 1 of 1

It is certified that error appears in the above-identified patent and that said Letters Patent is hereby corrected as shown below:

In the Claims

Claim 20, Column 13, Line 3, Replace "ARC" with "ASIC".

Signed and Sealed this  
Twelfth Day of December, 2017

Joseph Matal  
*Performing the Functions and Duties of the*  
*Under Secretary of Commerce for Intellectual Property and*  
*Director of the United States Patent and Trademark Office*